United States Patent
Paci et al.

(10) Patent No.: US 9,568,566 B2
(45) Date of Patent: Feb. 14, 2017

(54) MAGNETORESISTIVE SENSOR INTEGRATED IN A CHIP FOR DETECTING MAGNETIC FIELDS PERPENDICULAR TO THE CHIP AND MANUFACTURING PROCESS THEREOF

(71) Applicant: STMicroelectronics S.r.l., Agrate Brianza (IT)

(72) Inventors: Dario Paci, Sedriano (IT); Dino Faralli, Milan (IT); Andrea Picco, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 477 days.

(21) Appl. No.: 14/102,899

(22) Filed: Dec. 11, 2013

(65) Prior Publication Data
US 2014/0159717 A1 Jun. 12, 2014

(30) Foreign Application Priority Data

Dec. 12, 2012 (IT) ................ TO2012A1067

(51) Int. Cl.
*G01R 31/02* (2006.01)
*G01R 33/09* (2006.01)
*G01R 33/00* (2006.01)

(52) U.S. Cl.
CPC ........... *G01R 33/09* (2013.01); *G01R 33/0011* (2013.01); *G01R 33/0052* (2013.01); *G01R 33/096* (2013.01)

(58) Field of Classification Search
CPC ... G01R 33/0011; G01R 33/098; G01R 33/48; G01R 33/30; H01L 43/14; H01L 43/08
USPC ............................ 324/245–252, 200, 207.21
See application file for complete search history.

(56) References Cited

U.S. PATENT DOCUMENTS

| | | | |
|---|---|---|---|
| 7,095,226 B2 | 8/2006 | Wan et al. | |
| 7,271,586 B2 | 9/2007 | Bohlinger et al. | |
| 8,390,283 B2 | 3/2013 | Mather et al. | |
| 8,633,688 B2 | 1/2014 | Paci et al. | |
| 2009/0027048 A1 | 1/2009 | Sato et al. | |
| 2011/0193556 A1* | 8/2011 | Paci | G01R 33/07 324/251 |
| 2012/0161759 A1* | 6/2012 | Pozzati | B82Y 25/00 324/252 |
| 2013/0299930 A1 | 11/2013 | Paci et al. | |

OTHER PUBLICATIONS

Tumanski, S., "Thin Film Magnetoresistive Sensors," IOP Publishing Ltd, 2001, pp. 1-163.

* cited by examiner

*Primary Examiner* — Melissa Koval
*Assistant Examiner* — Trung Nguyen
(74) *Attorney, Agent, or Firm* — Seed IP Law Group LLP

(57) ABSTRACT

An integrated magnetoresistive sensor, formed in a chip including a substrate having a surface and an insulating region covering the surface of the substrate. A magnetoresistor, of a first ferromagnetic material, is formed in the insulating region and has a sensitivity plane parallel to the surface. A concentrator of a second ferromagnetic material is formed in the substrate and has at least one arm extending in a transverse direction to the sensitivity plane. The arm has one end in contact with the magnetoresistor.

23 Claims, 10 Drawing Sheets

MAGNETORESISTIVE SENSOR INTEGRATED IN A CHIP FOR DETECTING MAGNETIC FIELDS PERPENDICULAR TO THE CHIP AND MANUFACTURING PROCESS THEREOF

BACKGROUND

Technical Field

The present disclosure relates to a magnetoresistive sensor integrated in a chip for detecting magnetic fields perpendicular to the chip, as well as to its manufacturing process.

Detailed Description

In the following description, particular reference will be made to an anisotropic-magnetoresistor (AMR) sensor, without, however, being limited thereto, and the disclosure may be applied also to other types of magnetoresistive sensors, such as the giant-magnetoresistor (GMR) sensor and the tunneling-magnetoresistor (TMR) sensor and other integrated magnetic-field sensors that are sensitive to magnetic fields parallel to the chip integrating them.

As is known, magnetoresistive sensors exploit the capacity of appropriate ferromagnetic materials (referred to as "magnetoresistive materials", for example the material known as "permalloy" which is an NiFe alloy) to modify their own resistance in presence of an external magnetic field.

Currently, magnetoresistive sensors are obtained from strips of magnetoresistive material. In case of anisotropic magnetoresistive sensors, during the manufacturing process, the strip of magnetoresistive material may be subjected to an external magnetic field so as to present a preferential magnetization in a pre-set direction (referred to as "easy axis"), for example the longitudinal direction of the strip itself.

Prior to measurement of the external magnetic field, an initial magnetization state along the preferential magnetization axis is set via a current pulse through a set/reset coil. In absence of external magnetic fields, the magnetization maintains the direction set by the set/reset pulse, and the strip has maximum resistance in this direction. In presence of external magnetic fields having a different direction from the preferential magnetization direction, the magnetization and resistance of the strip change, as explained hereinafter.

In FIG. 1, a magnetoresistor 1 is formed by a strip 2 of magnetoresistive material having a longitudinal direction parallel to the axis X, which also is the preferential magnetization direction EA. In absence of external magnetic fields, the magnetoresistor 1 is thus traversed by a current I flowing in the longitudinal direction of the strip. When the magnetoresistor 1 is immersed in an external magnetic field Hy directed parallel to axis Y (HA, "hard axis"), the magnetization M rotates through an angle α depending upon the amplitude of the external magnetic field Hy. In this condition, the resistivity of the magnetoresistor 1 changes. The change may be detected by an external circuit, which is thus able to determine the amplitude of the external magnetic field Hy.

Moreover, as shown in FIG. 2, in order to linearize the plot of the resistance R as a function of the angle α at least in an operating portion of the curve (magnetic fields of small dimensions), it is known to form, on the strip 2 of magnetoresistive material, a plurality of transverse strips 3 (referred to as "barber poles"), of conductive material (e.g., aluminum), arranged at a constant distance and with an inclination of 45° with respect to the direction X.

In this situation, the direction of the current I changes, but not the magnetization.

Generally, to simplifying reading, the magnetoresistors 10 are connected so as to form a Wheatstone bridge, as shown for example in FIG. 3, which shows a magnetoresistive sensor 11 designed to detect a magnetic field directed along axis X. In particular, the magnetoresistive sensor 11 comprises four magnetoresistors 10a, 10b forming two mutually parallel branches 4a, 4b, wherein the magnetoresistors designated by 10a have transverse strips 3 arranged at a first angle, here +45°, and the magnetoresistors designated by 10b have transverse strips 3 arranged at a second angle, here −45°. The branches 4a, 4b define input terminals 5, 6 and output terminals 7, 8. The magnetoresistors 10a, 10b of one branch are arranged specularly to the magnetoresistors 10b, 10a of the other branch so that the magnetoresistor 10a of the first branch 4a is connected to the second input terminal 6 and the magnetoresistor 10a of the second branch 4b is connected to the first input terminal 5. The magnetoresistors 10b are arranged in a similar way. Between the input terminals 5, 6 a biasing voltage Vb is applied.

In absence of an external magnetic field parallel to the detection direction (here the field Hx), the output voltage Vo between the output terminals 7, 8 is approximately zero. Instead, in case of initial magnetization directed vertically downwards, an external magnetic field Hx causes an increase in the resistivity of the magnetoresistors 10a and a corresponding reduction of resistivity of the other magnetoresistors 10b. Consequently, each resistance variation due to an external field perpendicular to the magnetoresistors 10a, 10b causes a corresponding linear variation of the output voltage Vo, the value whereof thus depends in a linear way upon the external magnetic field Hx.

When it is desired to detect both the components of a magnetic field parallel to the plane of the device integrated in the chip, it is possible to arrange the magnetoresistors 10 perpendicularly to each other, as shown in the sensor 12 of FIG. 4, which illustrates for simplicity a magnetoresistor 10x, for detecting the component X, and a magnetoresistor 10y, for detecting the component Y. Obviously, each magnetoresistor 10x, 10y of FIG. 4 may be replaced by a respective Wheatstone bridge similar to that of FIG. 3, wherein the four magnetoresistors 10x are oriented perpendicularly to the four magnetoresistors 10y.

Because of the high sensitivity of the magnetoresistive sensors of the type indicated above, use thereof as electronic compasses in navigation systems has been proposed. In this case, the external field to be detected is the Earth's magnetic field. To a first approximation, the Earth's magnetic field may be considered parallel to the surface of the Earth, and compass reading may be made using the sensor 12, where X and Y represent the two directions of the plane locally tangential to the surface of the Earth. Since, however, the inclination of the compass with respect to the tangential plane entails reading errors, to correct the errors it is in practice common to have three sensors, each sensitive to a respective axis X, Y, Z.

To this end, the three sensors are perpendicular with respect to each other. Whereas creation of a sensor sensitive to fields oriented in two directions does not create difficulties, since they lie in a same plane, third direction detection is difficult, since prior art production methods construct a third sensor arranged in a plane perpendicular to the first two sensors.

Since current technologies do not enable industrial production at acceptable costs of vertical magnetoresistors, sensitive to the axis Z, in some compasses the sensor Z is obtained in planar form, as sensors X and Y, and the corresponding chip is attached on a base or frame in a vertical position, perpendicular to the sensors X and Y. However, in this case, the assembly operations are complex, and the end device is costly. Moreover, the packaged device has an excessive volume (in particular height), which does not enable use thereof in small apparatuses.

In order to solve this problem, it has been proposed to produce, alongside a planar magnetoresistor, a ferromagnetic concentrator transverse to the sensitivity plane of the magnetoresistor (see, for example, WO 2012/085296). For a better understanding, reference is made to FIG. 5, which shows a magnetoresistive sensor 15 formed in a chip 16 having a substrate 17 of conductive material, for example silicon, and an insulating layer 18. The substrate 17 has main surfaces 19, 20 parallel to the plane XY. The insulating layer 18 houses magnetoresistors 10z, which extend parallel to the main surfaces 19, 20 and to the plane XY and define the sensitivity plane of the sensor 15.

A concentrator 24 of "soft" ferromagnetic material (which may be magnetized easily and does not maintain magnetization after removal of the external magnetic field) extends in a trench 22 formed in the substrate 17 and extending throughout or almost throughout the thickness of the substrate 17. The concentrator 24 is here U-shaped and comprises an arm 24a having a length parallel to axis Z and much greater than its thickness. The arm 24a thus extends to near the main face 19 and is laterally offset with respect to the magnetoresistors 10z.

Consequently, when the magnetoresistive sensor 15 is subjected to an external magnetic field Hz directed along axis Z, the arm 24a causes concentration and deflection of the field lines and generation of a horizontal field component Hy oriented along axis Y and thus parallel to the sensitivity plane. In particular, the flux lines deflected and concentrated traverse the magnetoresistors 10z, thus enabling detection of the external magnetic field Hz using a reading circuit in a known way.

In this known magnetoresistive sensor, however, it has been noted that, in some cases, because of the vertical distance (in direction Z) between the concentrator 24 and the magnetoresistors 10z and because of the inevitable misalignments in a horizontal direction (here in direction Y) that give rise to a gap also in this direction, the magnetic field deflected and concentrated in the concentrator 24 spreads out (spread phenomenon). This phenomenon causes an undesirable reduction and above all a sensitivity variation between sensors formed in different semiconductor wafers or even between sensors formed in a same wafer.

BRIEF SUMMARY

One embodiment of the present disclosure is a magnetoresistive sensor that overcomes the drawbacks indicated above.

One embodiment of the present disclosure is a magnetoresistive sensor for detecting magnetic fields perpendicular to the chip. The sensor includes:
a chip including a substrate having a surface and an insulating region covering the surface of the substrate;
a first magnetoresistor of a first ferromagnetic material formed in the chip, the first magnetoresistor having a sensitivity plane parallel to the surface; and
a first concentrator of a second ferromagnetic material formed in the chip, the first concentrator including an arm extending in a transverse direction to the sensitivity plane and having an end in contact with the first magnetoresistor.

One embodiment of the present disclosure is a manufacturing process that includes:
manufacturing a magnetoresistive sensor integrated in a chip having a substrate and an insulating region, the substrate having a surface, the manufacturing including:
forming, in the chip, a magnetoresistor of a first ferromagnetic material having a sensitivity plane parallel to the surface; and
forming, in the chip, a concentrator of a second ferromagnetic material and having an arm extending in a transverse direction to the sensitivity plane and in contact with the magnetoresistor.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 6:
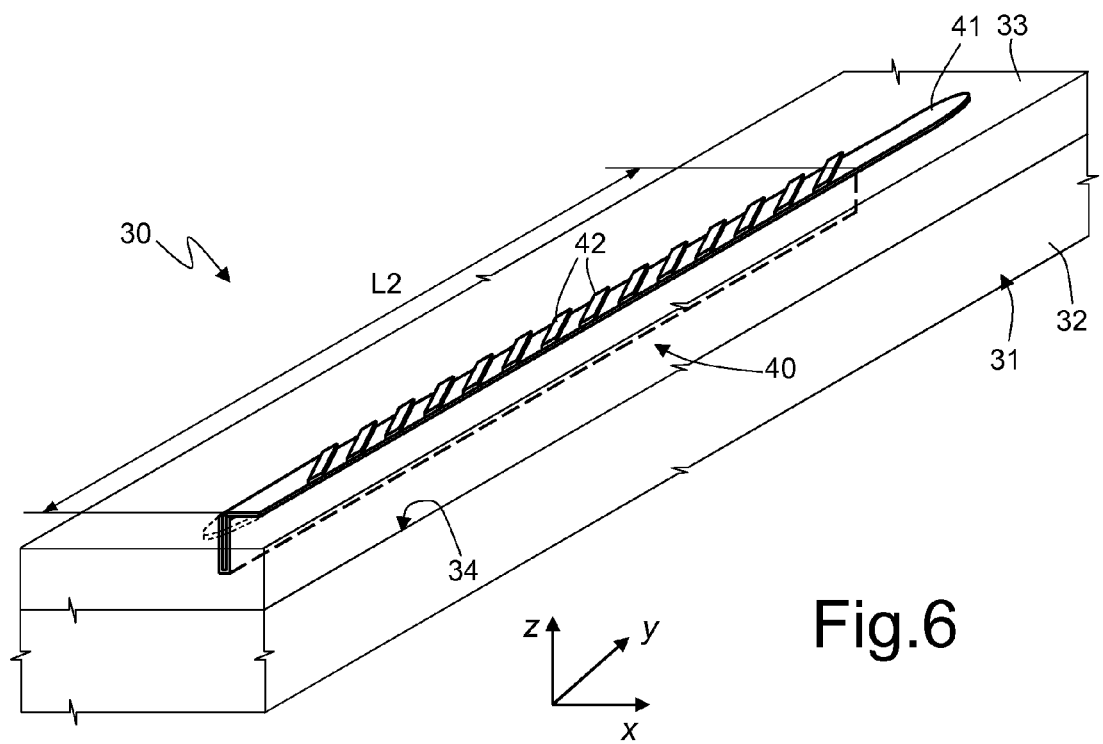
FIG. 6 shows a sectioned perspective view of the present magnetoresistive sensor.
Figure 7:
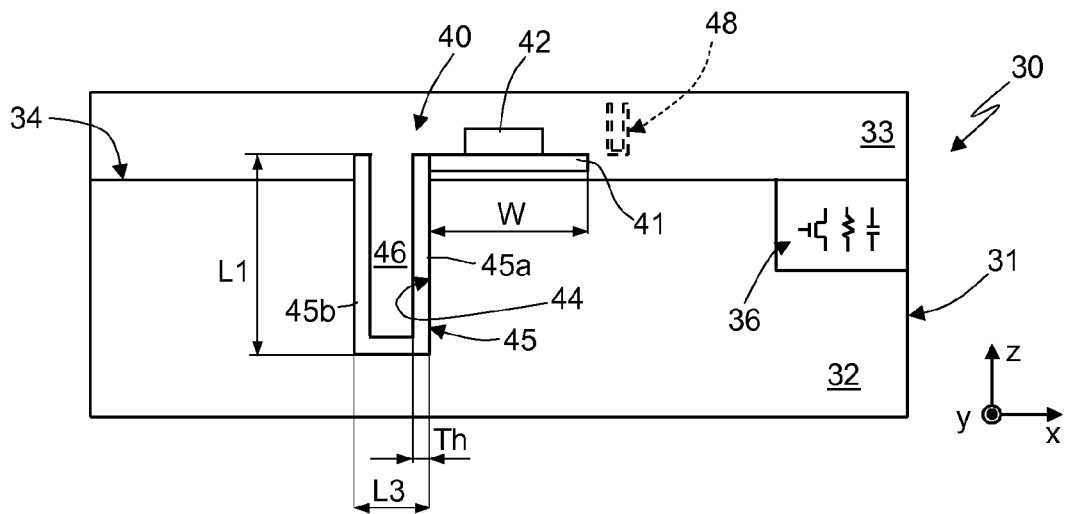
FIG. 7 is a cross-section of the magnetoresistive sensor of FIG. 6.

FIGS. 6 and 7 show a magnetoresistive sensor 30 formed in a chip 31 comprising a substrate 32, typically of semiconductor material, for example silicon, and an insulating region 33, for example of silicon oxide, typically formed by a plurality of stacked layers. The substrate 32 has a surface 34 covered by the insulating region 33 and extends parallel to the plane XY. At least one active area 36 within the substrate 32 (FIG. 7) may house electronic components 37, shown only schematically.

The insulating region 33 houses a magnetoresistor 40, for example an anisotropic magnetoresistor (AMR), of a planar type, having main directions (length, width) in a plane parallel to the plane XY and to the surface 34 and thus defining a sensitivity plane of the magnetoresistor 40.

Figure 1:
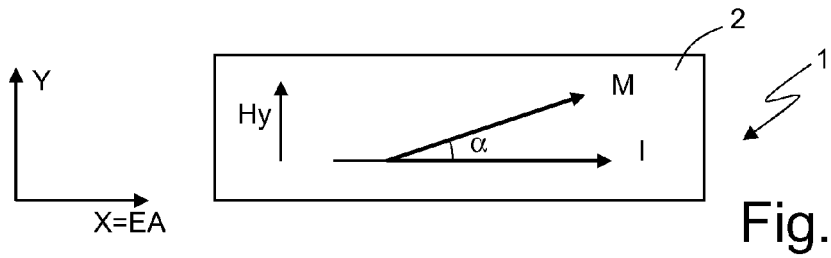
FIG. 1 is a schematic illustration of a magnetoresistor of a known type, and the direction of the corresponding electrical and magnetic quantities.
Figure 2:
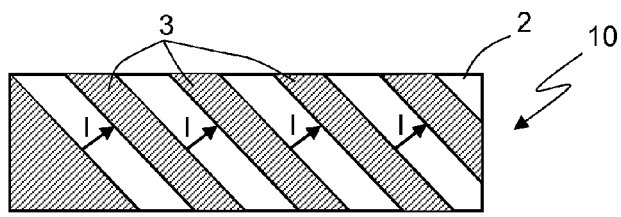
FIG. 2 shows the variation of the direction of the current in the known magnetoresistor with barber poles.
Figure 3:
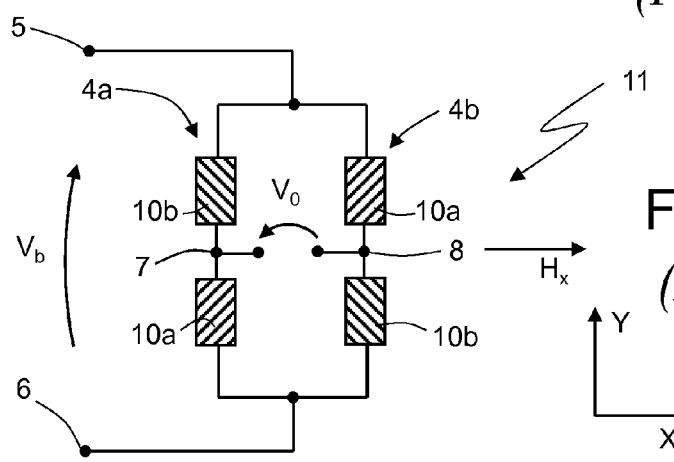
FIG. 3 shows a magnetoresistive sensor which uses known magnetoresistors connected to form a Wheatstone bridge.
Figure 4:
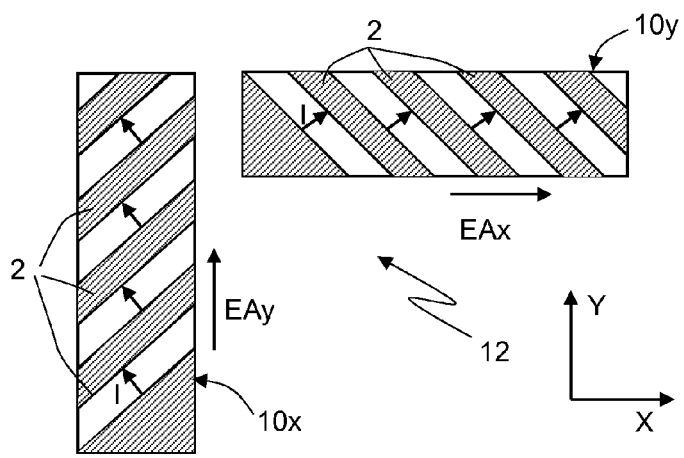
FIG. 4 shows a known arrangement of magnetoresistors of a sensor for detecting magnetic fields along two Cartesian axes parallel to the sensor plane.

In the illustrated example, the magnetoresistor 40 is similar to the magnetoresistor 10 of FIG. 2, and thus comprises a magnetoresistive strip 41 and transverse strips or "barber poles" 42. Alternatively, as discussed below with reference to FIG. 10, the magnetoresistor 40 may be formed by a plurality of magnetoresistive strips 41 connected to form a coil.

A cavity 44, such as a trench, extends within the substrate 32 and houses a concentrator 45 formed by a ferromagnetic material layer that coats the sides and the bottom of the trench 44. The concentrator 45 extends in part beyond the surface 34 of the substrate 32 (and thus the trench 44), into the insulating region 33.

The trench 44 is moreover filled with a filling region 46 of insulating material, typically the same material as the insulating region 33. In the cross-section of FIG. 7, the concentrator 45 is U-like shaped and comprises two arms 45a, 45b. One of the arms, here arm 45a, in the part projecting in the insulating region 33, is in direct contact with the magnetoresistive strip 41, reducing to zero the distance between the concentrator 45 and the magnetoresistor 41.

Here, the top part of arm 45a extends alongside the magnetoresistive strip 41 and is in contact with a longitudinal surface of the magnetoresistive strip 41.

The magnetoresistive strip 41 is made, for example, of a permalloy (NiFe) or of an NiFe and TaN multilayer. The transverse strips 42 are made of conductive material (for example, aluminum).

The concentrator 45 is made of a soft ferromagnetic material (i.e., it may be easily magnetized and does not maintain the magnetization after removal of the external magnetic field). For example, it is possible to use a cobalt-based amorphous alloy or a permalloy, typically non-anisotropic, or at least with easy axis not aligned with the vertical wall (axis Z).

The concentrator 45 is formed by a thin layer having a thickness Th much smaller than the length L1 of the arms 45a, 45b in direction Z (for example, the ratio between Th and L1 is from 10:1 to beyond 100:1) and than the length L2 in a longitudinal direction (here direction Y), approximately equal to the length of the magnetoresistive strip 41. For example, the thickness Th may be comprised between 10 nm and 1 μm, e.g., 30 nm, the length L1 of the arms 45a, 45b may be comprised between 5 and 500 μm, e.g., 10 μm, and the length L2 of the concentrator 45 (FIG. 6) may be comprised between 50 μm and 500 μm. Moreover, the width L3 of the base of the trench 44 may be for example 1-6 μm. In particular, it may be equal to the length L1 of the arms 45a, 45b. The thickness of the magnetoresistive strip 41 may be the same as or comparable to that of the concentrator 45.

In theory, deflection of the component Z of a magnetic field in a planar direction (plane XY) is the more effective the greater the length L1 of the arms 45a, 45b of the concentrator 45 and the more the side walls of the trench 44 (and thus the arms 45a, 45b) are inclined (until they become orthogonal) with respect to this plane. However, also concentrators 45 with arms 45a, 45b inclined in a direction not perpendicular to the plane XY are advantageous, even though an angle greater than 45° with respect to the surface 34 is preferable.

The sensor 30 may comprise an auxiliary concentrator 48 formed in the insulating region 33 and arranged laterally to the magnetoresistive strip 41, opposite the concentrator 45.

Figure 8:
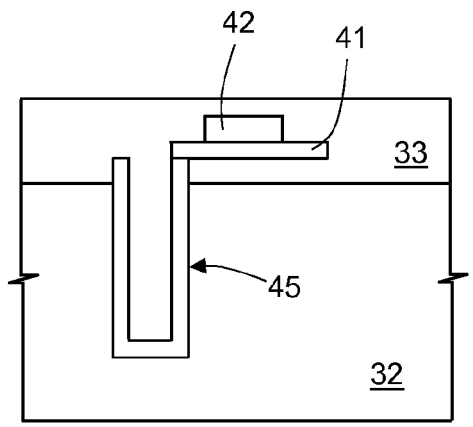
FIGS. 8 and 9 show variants of the magnetoresistive sensor of FIG. 7.

According to the embodiment of FIG. 8, the top edge of arm 45a is in contact with the bottom surface of the magnetoresistive strip 41. In this case, the arm 45 may have an end portion bent perpendicularly to the remaining portion of arm 45a, as shown in FIGS. 15A-16C.

Figure 9:
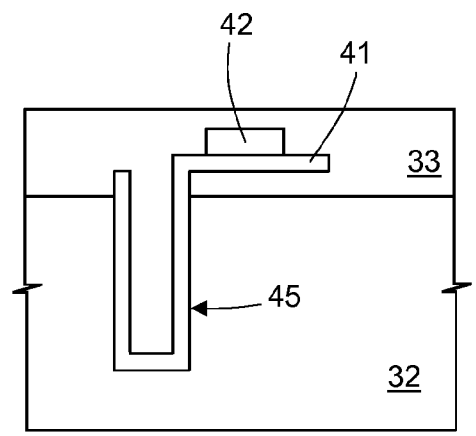

In FIG. 9, the concentrator 45 and the magnetoresistive strip 41 are formed in a same deposited ferromagnetic layer.

Figure 10:
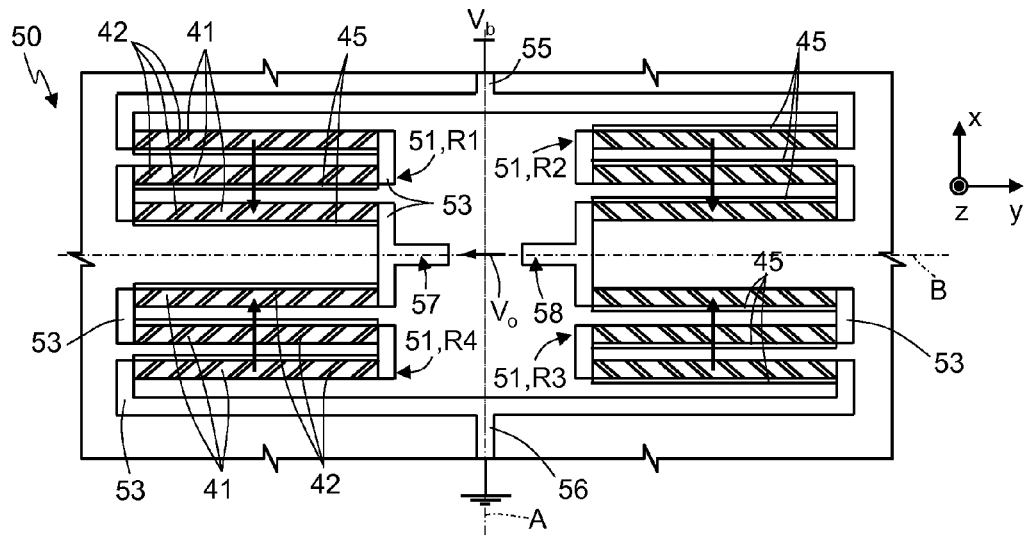
FIG. 10 shows the layout of a device which uses the magnetoresistive elements of FIGS. 6-9.

FIG. 10 shows a magnetoresistive sensor 50 insensitive to magnetic fields oriented parallel to the plane XY.

Figure 11:
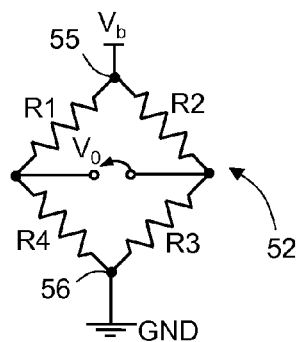
FIG. 11 is an electrical equivalent of the device of FIG. 10.

In detail, the magnetoresistive sensor 50 comprises four magnetoresistors 51 forming corresponding resistors R1-R4, coplanar and connected so as to form a Wheatstone bridge 52 (see also the electrical equivalent of FIG. 11). Moreover, in the example shown, each magnetoresistor 51 is formed by a plurality of magnetoresistive strips 41 extending longitudinally in the direction of axis Y (easy axis EA) and connected at the ends by connection lines 53. In particular, the connection lines 53 also connect first terminals of the resistors R1, R2 together and to a power-supply input 55 of the bridge 52; first terminals of the resistors R3, R4 together and to a grounding input 56; second terminals of the resistors R1, R4 together and to a first output terminal 57; and second terminals of the resistors R2, R3 together and to a second output terminal 58. In practice, the resistors R1 and R4 form a first branch of the bridge 52, and the resistors R2 and R3 form a second branch.

The resistors R1-R4 are the same as each other as regards the geometrical and electrical characteristics of the magnetoresistive strips 41, but have transverse strips 42 inclined at ±45° with respect to axis Y. In particular, in the example shown, the resistors R1-R4 are arranged symmetrically with respect to a first symmetry axis A parallel to axis X. In fact, the resistors R1, R4 of the first branch of the bridge 52 have transverse strips 42 oriented at −45° (+135° with respect to axis Y and are arranged symmetrically to the resistors R2, R3 of the second branch of the bridge 52, the resistors R2, R3 having transverse strips 3 oriented at)+45° (+225° with respect to axis Y. Moreover, the resistors R1-R4 are arranged symmetrically (apart from the orientation of the transverse strips 42) about a second symmetry axis B parallel to axis Y.

In the example shown, a concentrator 45 is arranged laterally to each magnetoresistive strip 41, as shown in FIGS. 6-9. In the considered example, the concentrators 45 extend on a same first side of the resistors R1, R3 (bottom side, in the top plan view of FIG. 10, facing the negative direction of axis X) and on a same second side of the resistors R2, R4 (top side, in the top plan view of FIG. 10, facing the positive direction of axis X).

As discussed in WO 2012/085296, previously cited, the configuration shown, wherein the current flows at 45° (225°) with respect to axis Y in resistors R1, R4 and flows at 135° (305°) with respect to axis Y in resistors R2, R3, it may be shown that the output voltage V0 on terminals 57-58 is sensitive only to the components Z and insensitive to the components X and Y of external magnetic fields.

In the embodiments of FIGS. 6-10, thanks to the direct contact between the/each magnetoresistive strip 41 and the corresponding concentrator 45, the concentration effect is maximized, since no gaps exist and substantially all the flux lines concentrated by each concentrator 45 are deflected in the corresponding magnetoresistive strip 41.

In order to prevent direct electrical contact between the magnetoresistive strips 41 and the respective concentrators 45 from causing leakages due to a parallel path for the currents flowing in the sensor 30, 50, and thereby prevent the magnetoresistor 40 from working in a low linearity and low resistance variation area as a function of the external magnetic field, in particular if the length L1 of the arm 45a is comparable with the width W of the magnetoresistive strip 41 (FIG. 7), it is possible to operate in various ways.

According to a first possibility, the material of the concentrator(s) 45 is much more resistive than the respective magnetoresistive strip 41; thereby, it forms a parallel resistance of a much greater value and so confines the majority of the current in the magnetoresistive strip 41. For example, this may be obtained if the magnetoresistive strip/strips 41 are of NiFe and the concentrator is of a cobalt-based alloy, for example, CoFe or CoFeSiB, as described in greater detail hereinafter with reference to FIGS. 15 and 16.

Alternatively, the concentrator 45 could include a thin resistive layer, for example of TaN, arranged between a conductive portion of the concentrator 45 and the magnetic strip 41. For example, in the embodiment of FIG. 7, the thin resistive layer could form the external wall of the concentrator 45 (thus, between the conductive portion of the concentrator and the trench 44, for the portion of the concentrator within the substrate, and as a continuation of the trench 44, for the portion of the concentrator 45 projecting in the insulating region 33).

Instead, in the embodiment of FIG. 8, the thin resistive layer could extend underneath the magnetoresistive strip 41, between the latter and the bent edge or end of the conductive portion of the arm 45a, as described hereinafter with reference to FIGS. 16A-16C.

Figure 12:
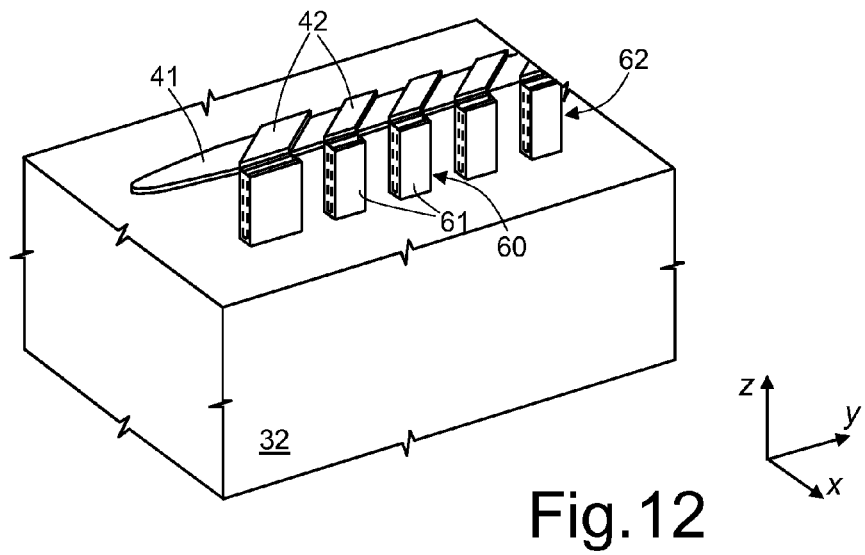
FIG. 12 shows a sectioned perspective view of a part of another magnetoresistive sensor.

According to another possibility, the electrical path in the concentrator is interrupted. For example, unlike what is shown in FIGS. 6 and 7, where the concentrator 45 is formed by a continuous layer which extends longitudinally in direction Y, the concentrator could be formed by a plurality of portions insulated from each other, following each other in direction Y, as shown in FIG. 12.

In detail, here the substrate 32 comprises a plurality of separate minitrenches 60. The minitrenches 60 may have a dimension (in direction Y) smaller than the depth (in direction Z). For example, the dimension of each microtrench 60 in the direction Y may be comprised between 3 and 200 µm, e.g., 6-8 µm. For the rest, the minitrenches 60 may have the dimensions indicated with reference to the trench 44 of FIGS. 6 and 7.

The minitrenches 60 are aligned with respect to each other in direction Y; for example, they may be spaced from each other, in a longitudinal direction of the magnetoresistive strip 41 (direction Y) by a distance comprised between 2 and 20 µm. Moreover, the minitrenches 60 have a side (in FIG. 12 the left side) aligned to the magnetoresistive strip 41.

Each minitrench 60 accommodates a concentrator segment 61 that coats the side and bottom walls of the minitrenches 60 and may project partially in the insulating region 33 (not shown, for clarity), in a way similar to FIGS. 6-10. Preferably, in a way not shown, each concentrator segment 61 includes a conductive portion and an insulating layer extending between the conductive portion of the concentrator segment and the respective minitrench 60.

In addition, as shown in FIGS. 6-10, a top portion of a side of each concentrator segment 61 (in FIG. 12 the left side) is aligned and in contact with the magnetoresistive strip 41.

The concentrator segments 61 are thus also aligned parallel to the magnetoresistive strip 41 and form as a whole a concentrator 62.

Since the concentrator segments 61 are separate from each other, the current flowing in the magnetoresistor is forced to remain in the magnetoresistive strip 41, preventing any current leakage or variations in the electrical and sensitivity characteristics of the magnetoresistor.

Figure 5:
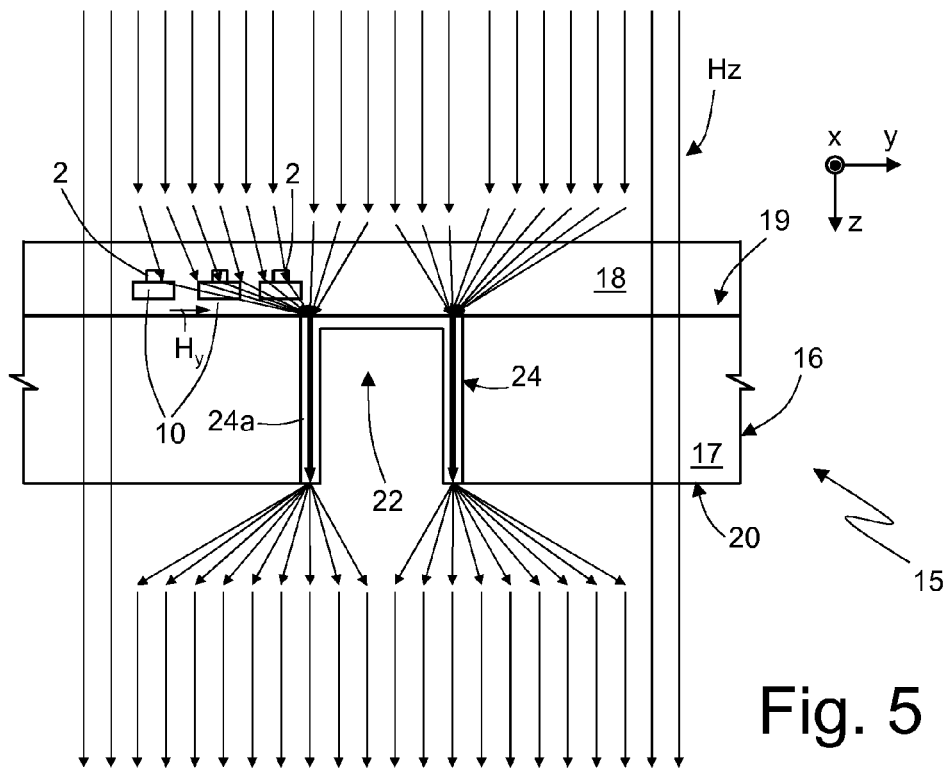
FIG. 5 shows a cross-section through a known sensor.

With the solutions described, for same values of L1 and Th, it is possible to obtain a sensitivity gain of approximately 1.5 with respect to the magnetoresistive sensor of FIG. 5, without modification of area and without modifying critical features, such as linear behavior, and rejection in regard to transverse components of field and noise.

In addition, the obtainable magnetoresistive sensor has an improved repeatability, and has low sensitivity to process parameters variations (such as the thickness of the oxide layer underneath of the magnetoresistive strips 41 and possible misalignments).

The described magnetoresistive sensor may be manufactured, for example, as discussed hereinafter.

FIGS. 13A-13E show an embodiment of a magnetoresistive sensor 30 wherein the concentrator 45 or 62 is of the same material as the magnetoresistive strip 41.

In detail, initially (FIG. 13A), via a lithographic technique and a deep dry silicon chemical etching, the trench 44 or 62 is formed in the substrate 32 and may extend throughout the length of the magnetoresistive strip 41 as in FIG. 6 or be formed by a plurality of minitrenches 60 as in FIG. 12.

Figure 13A:
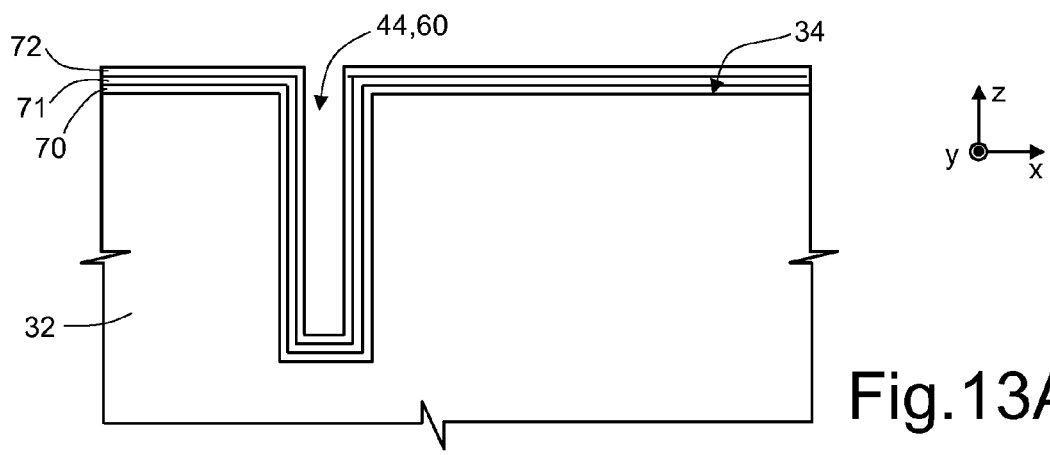
FIGS. 13A-13E show cross-sections through a semiconductor material wafer in successive manufacturing steps of the magnetoresistive sensor of FIG. 9, according to one embodiment.

A first insulating layer 70, for example formed by a thin stack of thermal oxide-nitride, is then grown in the trench 44 and on the surface 34. For example, with microtrenches 61 having the dimensions indicated above, the first insulating layer 70 may have a thickness comprised between 20 and 200 nm. Then, a ferromagnetic layer 71 is deposited, for example NiFe having a thickness comprised between 1 and 100 nm. The ferromagnetic layer 71 is deposited using a technique enabling a good coating of the walls of the trench 44 to be obtained, for example sputtering deposition, physical vapor deposition (PVD), atomic layer deposition (ALD), chemical vapor deposition (CVD) or electrochemical deposition (ECD). Then a protective layer 72, for example, of TaN with a thickness comprised between 10 and 50 nm, is deposited by CVD, thereby the structure of FIG. 13A is obtained.

Next (FIG. 13B), a second insulating layer 74 is deposited. The second insulating layer 74 may be a thick oxide layer, having a thickness comprised between 200 and 2000 nm, so as to fill the trench 44.

Next (FIG. 13C), after thinning the surface portion of the second insulating layer 74, for example, via chemical-mechanical planarization (CMP), the magnetoresistive strip 41 is defined via lithography. To this end, a photoresist layer is deposited and defined so as to form a strip mask 75 coating the layers deposited in the trench 44 and where the magnetoresistive strip 41 is to be formed. Then, using the strip mask 75, and by dry etching, the exposed portions of the second insulating layer 74 are removed. The remaining surface portion of the second insulating layer 74 thus forms a hard mask 74a.

After removing the strip mask 75 (FIG. 13D), the protective layer 72 and the ferromagnetic layer 71 are patterned, using the hard mask 74a and carrying out an ion beam etch.

Then (FIG. 13E), the hard mask 74a is removed so that the ferromagnetic layer 71 and the corresponding protective layer 72 are exposed and the second insulating layer 74 remains only within the trench 44, to form the filling region 46 of FIG. 7. Standard steps follow for manufacturing the magnetoresistive sensor 30, including forming the transverse strips 42, for example depositing a first metallization layer 77, for example of TiW, with a thickness comprised between 10 and 100 nm, having the function of favoring adhesion and contacting between the adjacent layers, and a second metallization layer 78, for example of Al, with a thickness comprised between 100 and 1000 nm. The process then comprises depositing an intermetal dielectric layer, for example of TEOS with a thickness comprised between 1 and 3 μm, and corresponding CMP; depositing a further dielectric layer, for example, TEOS with a thickness comprised between 100 and 1000 nm, to form, together with the intermetal dielectric layer, a third insulating layer 79; and opening vias towards the first or second metallization layer 77, 78. The structure of FIG. 13E is thus obtained. Next, at least one third metal layer (not shown) is deposited and patterned, for example of Al or Cu, having a thickness comprised between 1 and 5 μm and used for producing set/reset coils for magnetization of the magnetoresistive strip 41; a final passivation layer (not shown) is deposited, and finally the contact pads (not shown) are opened.

Figure 14A:
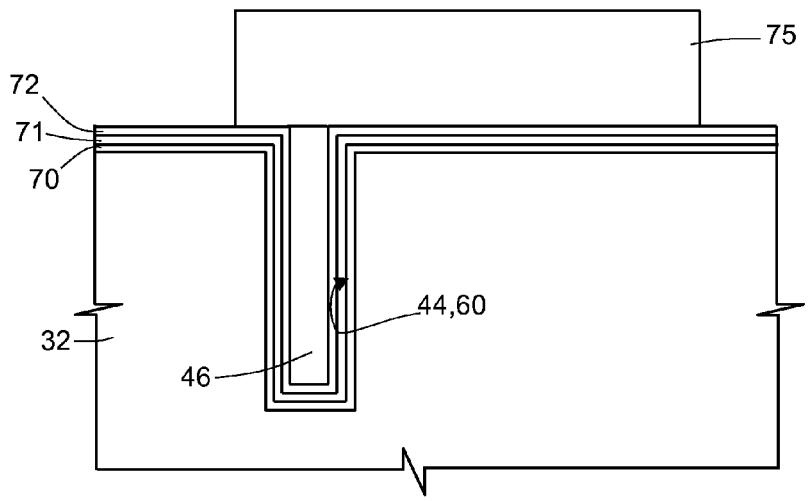
FIGS. 14A-14C show cross-sections through a wafer of semiconductor material in successive manufacturing steps of the magnetoresistive sensor of FIG. 9, according to a different embodiment.

As an alternative to the above, the ferromagnetic layer 71 may be patterned directly via a resist layer, without using the hard mask 74a. In this case (FIG. 14A), after forming the trench 44, depositing the first insulating layer 70, the ferromagnetic layer 71 and the protective layer 72, the strip mask 75 is formed immediately and the layers 71, 72 are etched to form the magnetoresistive strip 41.

Figure 14B:
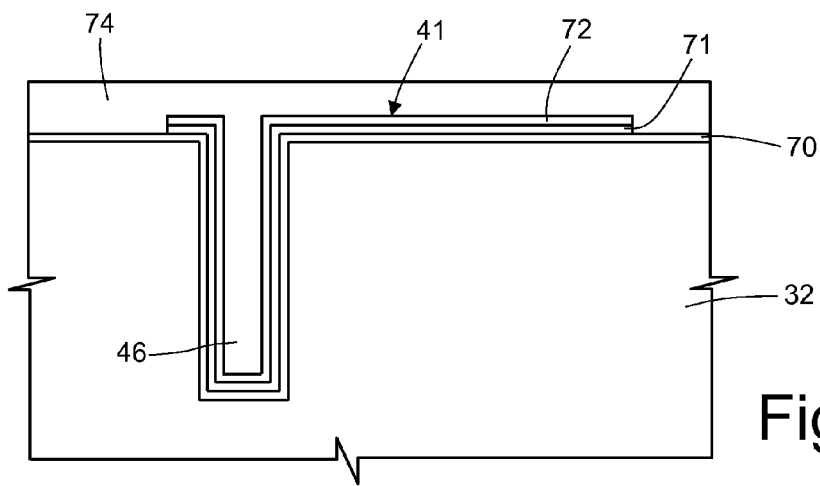

After removing the strip mask 75 (FIG. 14B), the second insulating layer 74 is deposited and is planarized, for example via CMP, to a thickness of approximately 400 nm. Next (FIG. 14C), vias 80 (just one whereof is visible in the figure) are opened in the second insulating layer 74, above the magnetoresistive strip 41, until the protective layer 72 is reached. Alternatively (in a way not shown) etching may remove also the protective layer 72, until the ferromagnetic layer 71 is exposed. The vias 80 are aligned in the longitudinal direction of the magnetoresistive strip 41 (direction Y in FIG. 6, perpendicular to the drawing sheet) and have the desired parallelogram shape for the transverse strips 42. Next, the first and the second metallization layers 77, 78 are deposited and patterned, fill the via 80 and, after patterning, form the transverse strips 42.

The process then proceeds as described above with depositing one or more dielectric layers, the second metal layer, and the final passivation layer, and with opening the pads.

FIGS. 15A-15E show successive steps of a manufacturing process based upon the use of two different materials for the concentrator 45, 62 and the magnetoresistive strip 41.

In detail, initially and in a way similar to the above (FIG. 15A), the trench 44 is formed, the first insulating layer 70 and a first ferromagnetic layer 82, similar to ferromagnetic layer 71 of FIGS. 13 and 14, are deposited. Here, the trench 44 may be continuous, as in FIG. 6, or formed by a plurality of minitrenches 60, as shown in FIG. 12.

Then a concentrator mask 83 is formed and coats the trench 44, and the surface part of the first ferromagnetic layer 82 is removed so as to define the concentrator 45, 62.

After removing the concentrator mask 83 (FIG. 15B), a first protective layer 84 of highly resistive material, such as TaN, a second ferromagnetic layer 85, for example of NiFe, and a second protective layer 86, of TaN, are deposited. The first protective layer 84 is optional, in particular, when the first ferromagnetic layer 82 has a much higher resistivity than the ferromagnetic layer 85, but is preferable, when the second ferromagnetic layer 85 has a resistivity comparable or equal to the first ferromagnetic layer 82 (for example, they are of the same material) and the trench 44 is continuous for a substantial portion of the length of the magnetoresistive strip 41.

The second ferromagnetic layer 85 may have the same thickness as the first ferromagnetic layer 82.

Next (FIG. 15C), the strip mask 75 is formed, and the layers 85 and 86 are etched to form the magnetoresistive strip 41.

Figure 13B:
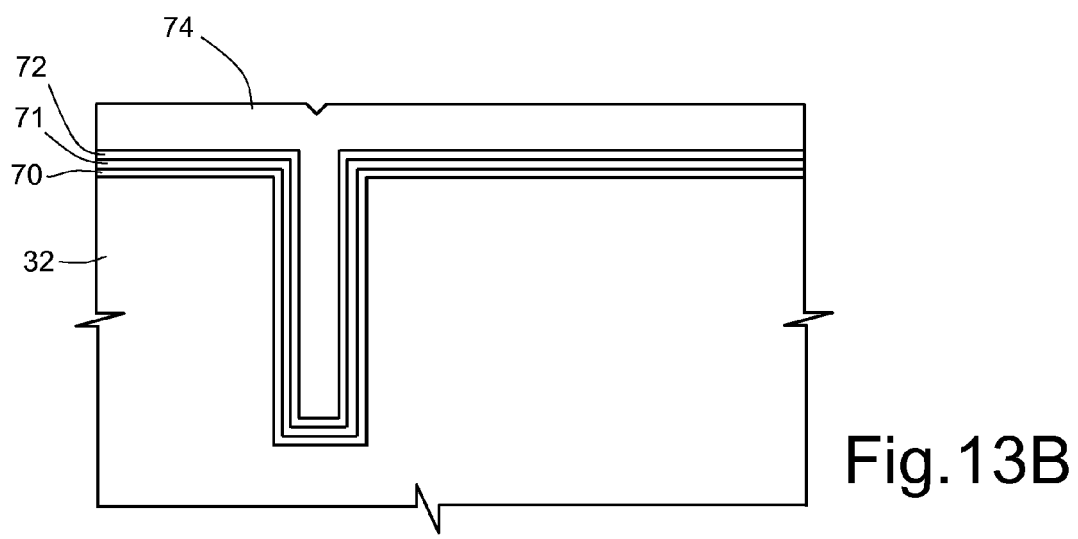

After removing the strip mask 75 (FIG. 15D), a filling layer 90 is deposited, for example a thick oxide layer, having a thickness comprised between 200 and 2000 nm, so as to fill the trench 44 or the minitrenches 60, as for the second insulating layer 74 of FIG. 13B. The filling layer 90 is then planarized via CMP.

Figure 14C:
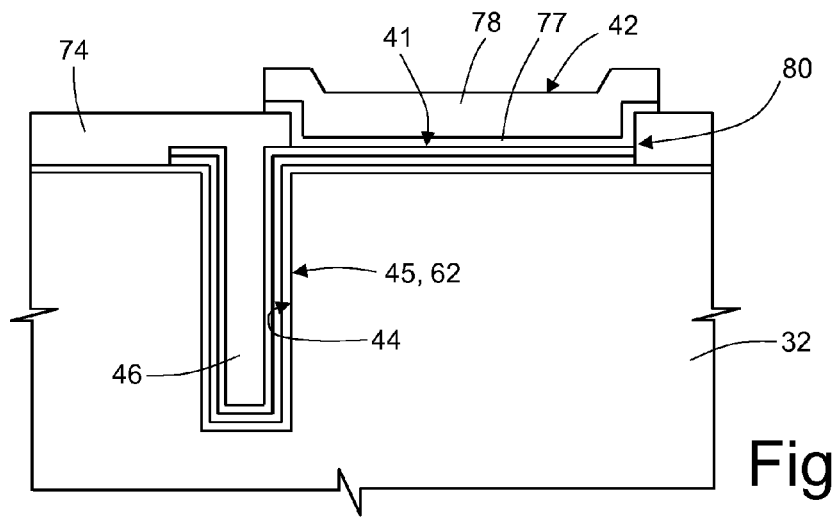

Next (FIG. 15E), similarly to what described with reference to FIG. 14C, vias 80 (only one whereof is visible in the figure) are opened in the filling layer 90, above the magnetoresistive strip 41, until the second protective layer 86 is reached, the first and the second metallization layers 77, 78 are deposited and patterned, so as to fill the via 80 and, after patterning, form the transverse strips 42. Final steps then follow.

Figure 13C:
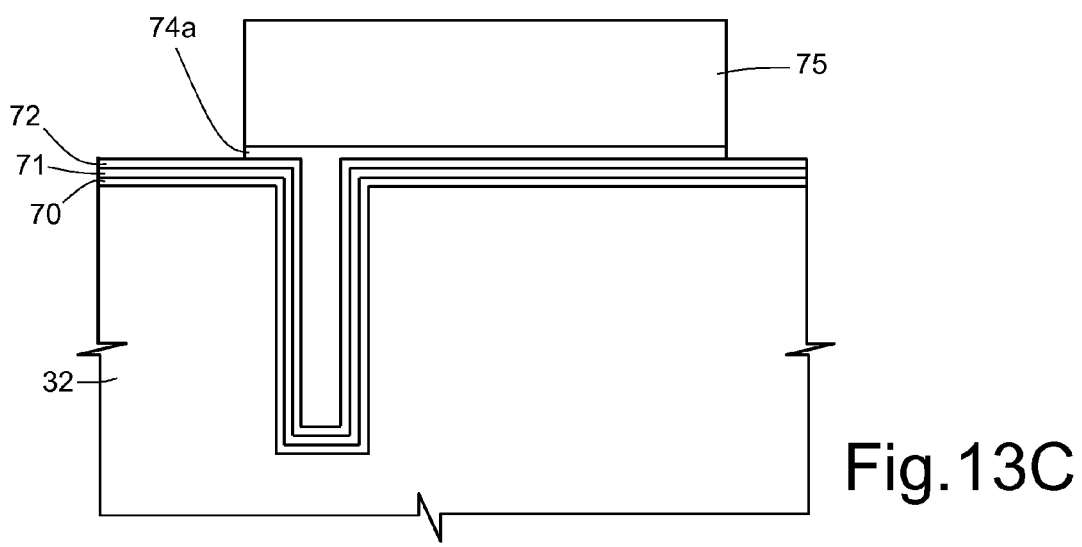
Figure 13D:
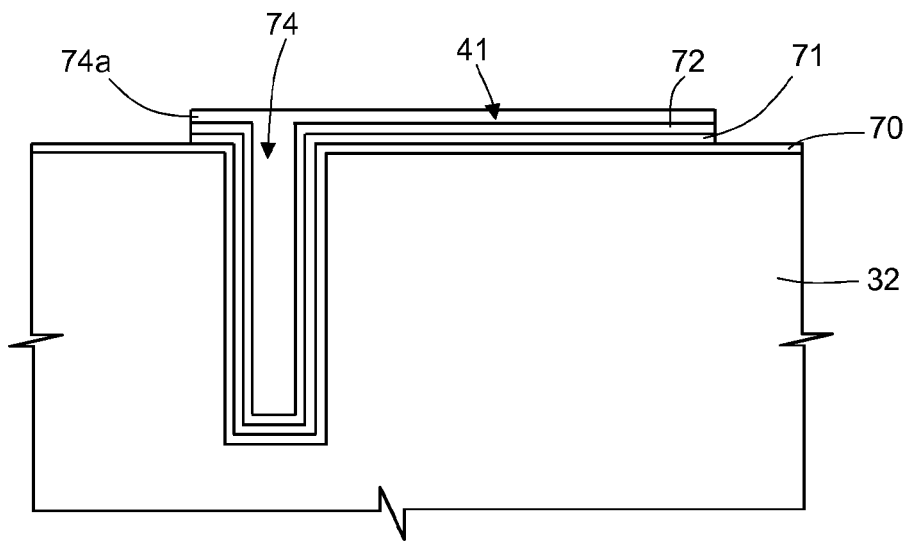
Figure 13E:
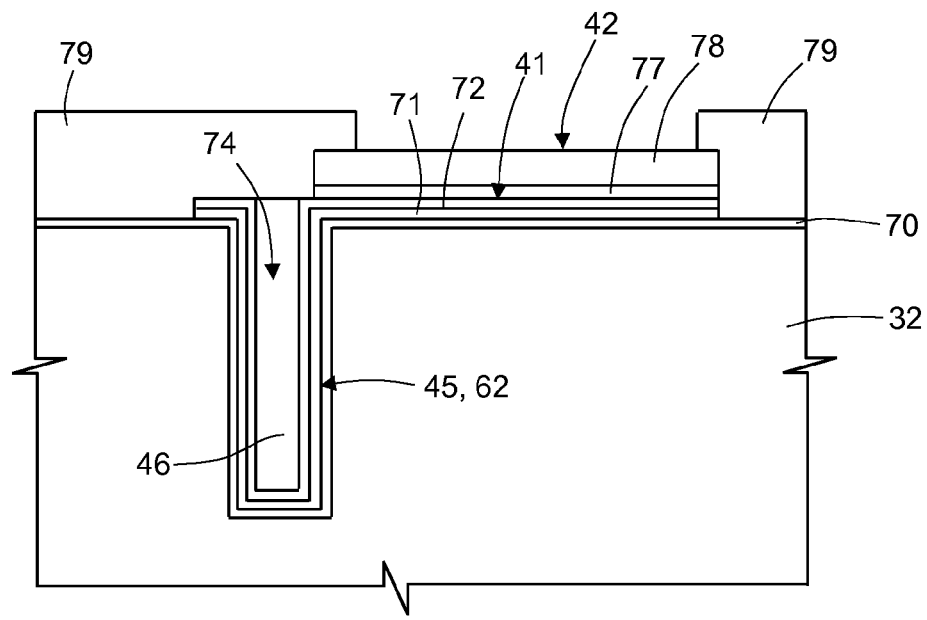
Figure 15A:
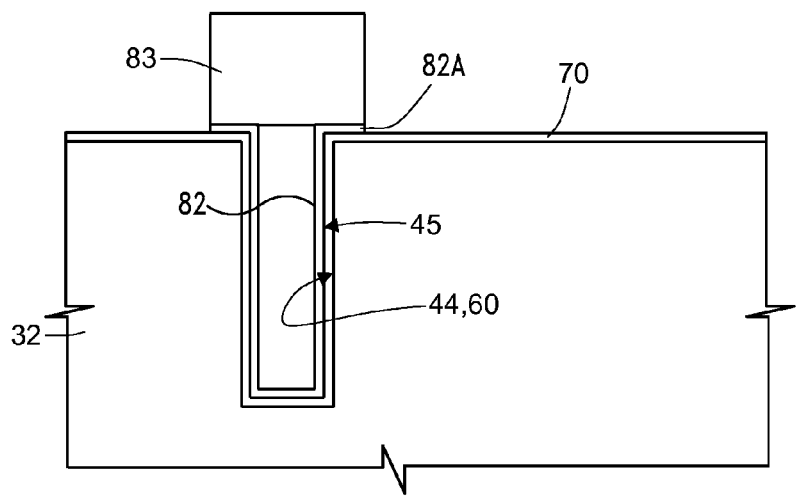
FIGS. 15A-15E show cross-sections through a semiconductor material wafer in successive manufacturing steps of the magnetoresistive sensor of FIG. 8, according to another embodiment.
Figure 15B:
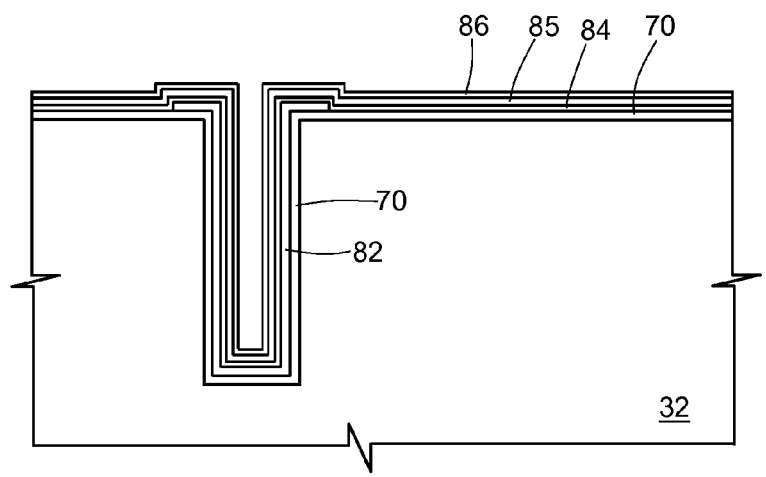
Figure 15C:
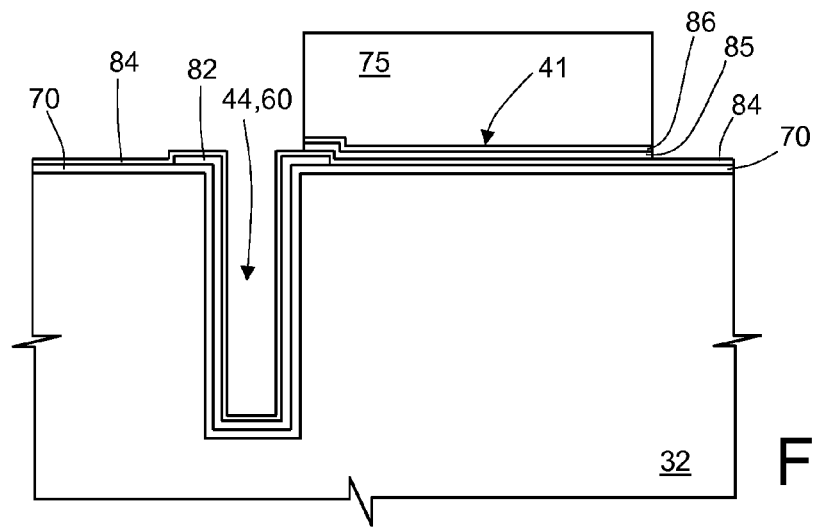
Figure 15D:
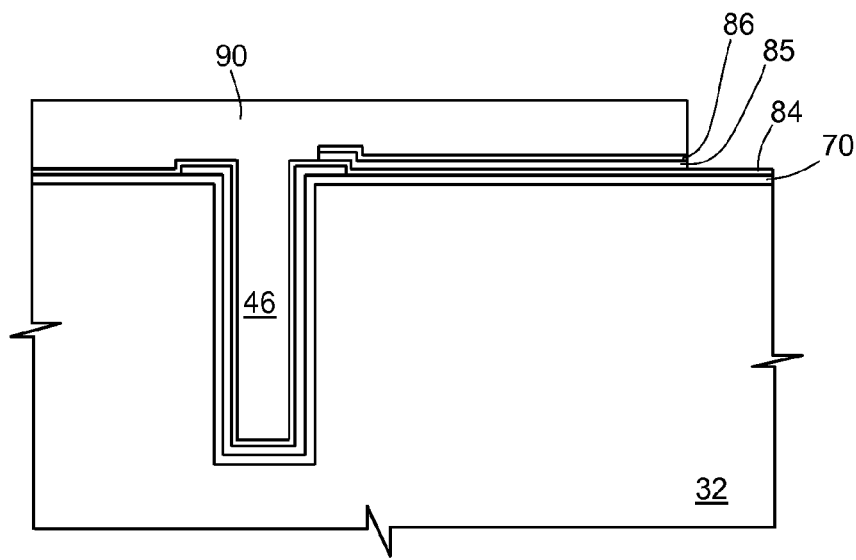
Figure 15E:
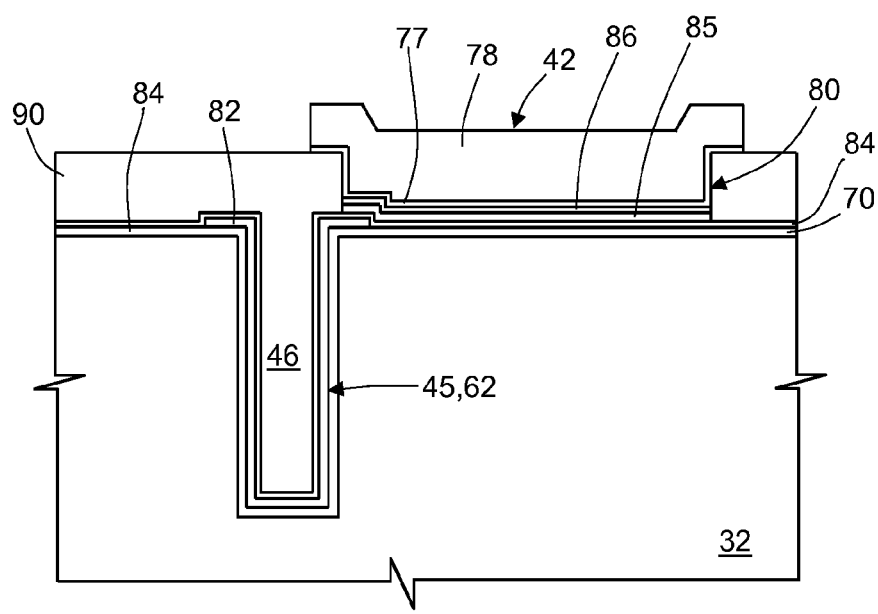

According to a different embodiment, prior to forming the concentrator mask 83 of FIG. 15A, the trench 44 may be filled with oxide and planarized via CMP, as described with reference to FIG. 13C. In this way, it is possible to use a more standard resist-coating technique.

Figure 16A:
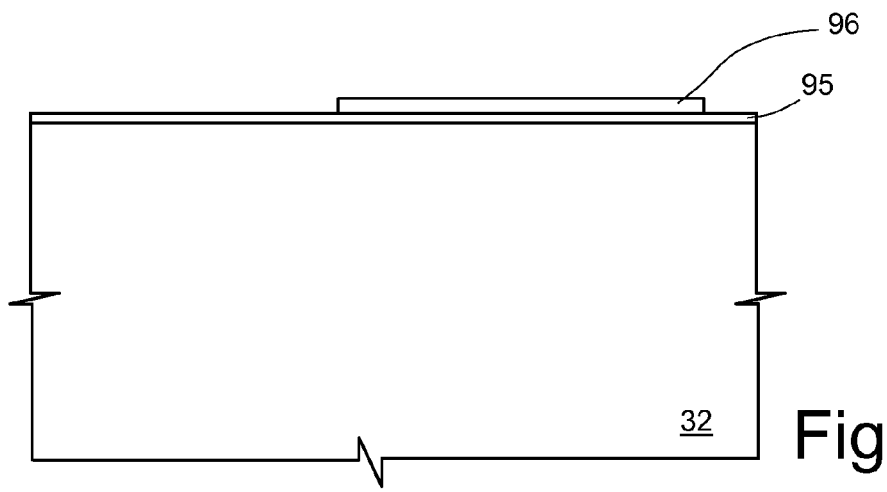
FIGS. 16A-16C show cross-sections through a semiconductor material wafer in successive manufacturing steps of the magnetoresistive sensor of FIG. 8, according to a different embodiment.
Figure 16B:
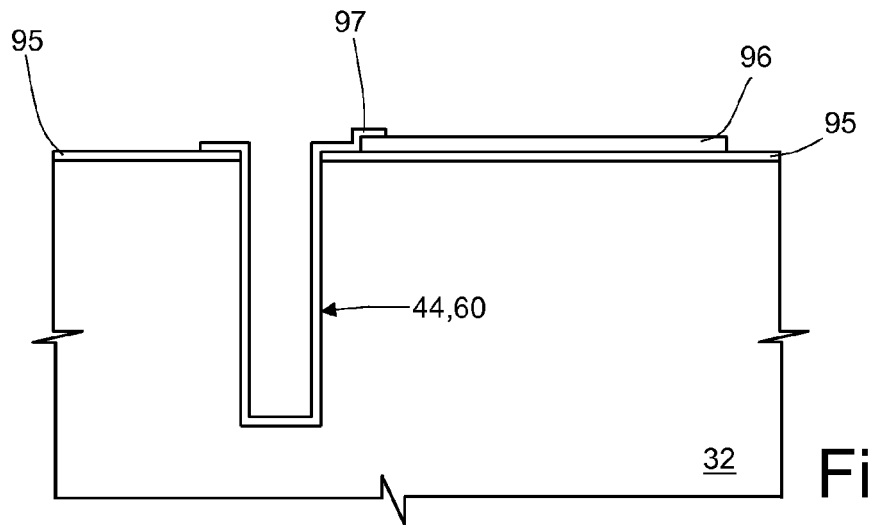
Figure 16C:
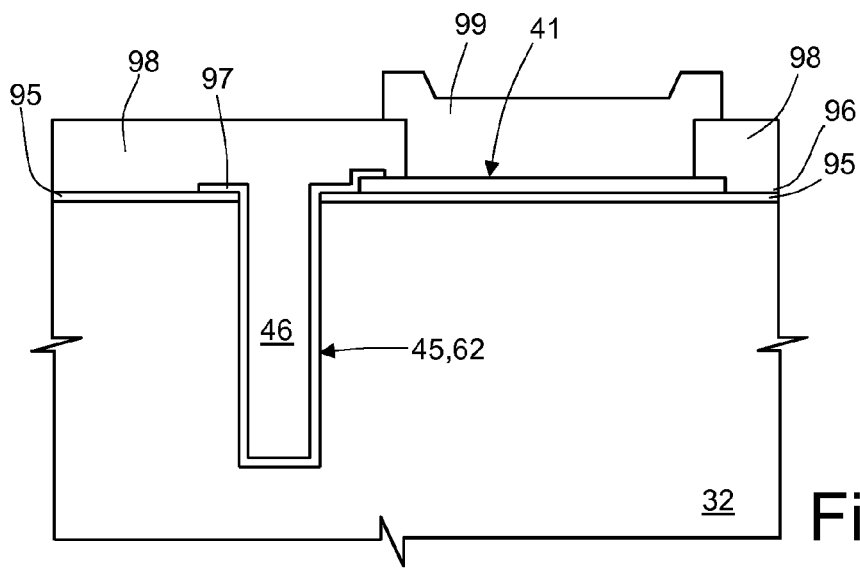

Another variant, shown in FIGS. 16A-16C, provides for forming the ferromagnetic layer prior to the trench. In detail, according to this variant, prior to forming the trench, the substrate 32 is coated with an insulating layer 95. Then, a ferromagnetic layer 96 is deposited and patterned (for example, a single layer of NiFe or a double layer of NiFe—TaN or a triple layer of NiFe—TaN—SiO$_2$ or of NiFe—TaN—SiN) (FIG. 16A). The trench 44 is formed through the ferromagnetic layer, and a concentrator layer 97, for example, of NiFe, is deposited and patterned to obtain the concentrator 45 (FIG. 16B). A trench-filling layer 98, e.g., of TEOS is deposited, planarized via CMP and patterned. Finally, the double barber-pole layer 99 is deposited and patterned (FIG. 16C). The final steps described above then follow.

The device and the process described herein have numerous advantages.

First, a magnetoresistive sensor is obtained, for example a planar triaxial AMR sensor, that can be integrated in a single chip. In this way, the imprecisions in the direction of the detected magnetic field are reduced, thanks to the reduction of the misalignments of the magnetoresistors.

The sensor as a whole is particularly compact, and thus may be easily used in systems and apparatuses even of small dimensions.

Assembly of the sensor as a whole is of a standard type, and thus does not require complex operations and steps for positioning, fixing, and ad hoc connecting the chips. Consequently, the manufacturing costs are reduced.

Just a few operations are used more than for a standard AMR flow, which enables manufacturing costs comparable to those of similar devices that use the same technology.

The sensor may be manufactured with lower costs as compared to the case of a vertical chip, not only for the reasons referred to above, but also because it has a single chip, so that the total silicon area for all three spatial directions is smaller.

The sensitivity of the sensor is considerably greater than in known solutions with planar Z sensor.

The final device is less sensitive to process spreads as compared to known solutions.

The magnetoresistive described sensor may then be advantageously used in electronic compasses and in devices for detecting magnetic fields with low amplitude.

Finally, it is clear that modifications and variations may be made to the sensor and to the manufacturing process described and illustrated herein, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated magnetoresistive sensor, comprising:
a chip including a substrate having a surface and an insulating region covering the surface of the substrate
a ferromagnetic first magnetoresistor formed in the chip, the first magnetoresistor extending lengthwise in a direction parallel to the surface and having a sensitivity plane parallel to the surface, the first magnetoresistor being configured to conduct a current; and
a ferromagnetic first concentrator formed in the chip, the first concentrator including an arm extending in a transverse direction to the sensitivity plane and having an end in contact with the first magnetoresistor.

2. The sensor according to claim 1, wherein the first magnetoresistor extends into the insulating region, the substrate has a trench opening on the surface, the arm of the first concentrator extends within the trench, and the end of the arm projects from the trench and extends into the insulating region.

3. The sensor according to claim 1, wherein the first magnetoresistor and first concentrator are of at least one of a cobalt-based alloy and a Fe-Ni alloy.

4. The sensor according to claim 1, wherein the end of the arm has a bent portion directed parallel to the sensitivity plane and in contact with the first magnetoresistor.

5. The sensor according to claim 1, wherein the first magnetoresistor includes a magnetoresistive strip, the magnetoresistive strip and the first concentrator being formed in a same ferromagnetic material layer.

6. The sensor according to claim 1, wherein the first magnetoresistor has an elongated shape having a longitudinal direction, and the first concentrator includes a plurality of concentrator segments in contact with the first magnetoresistor, separated from each other, and aligned with each other in the longitudinal direction.

7. The sensor according to claim 1, comprising:
a plurality of magnetoresistors including the first magnetoresistor, the magnetoresistors being connected to form a Wheatstone bridge and each including a magnetoresistive strip and a plurality of conductive transverse strips arranged on top of the magnetoresistive strip; and
a plurality of concentrators including the first concentrator, the concentrators extending parallel to and in contact with the magnetoresistive strips, respectively.

8. The sensor according to claim 1, wherein the substrate is of silicon semiconductor material.

9. The sensor according to claim 1, forming an integrated electronic compass or a high-sensitivity magnetic-field detector.

10. The sensor according to claim 1, wherein a first end of the first magnetoresistor is electrically coupled to a power supply input and a second end of the first magnetoresistor is electrically coupled to an output terminal.

11. The sensor according to claim 1, wherein the first magnetoresistor and the concentrator are made of different materials with respect to each other.

12. A process, comprising:
manufacturing a magnetoresistive sensor integrated in a chip having a substrate and an insulating region, the substrate having a surface, the manufacturing including:
forming, in the chip, a magnetoresistor of a first ferromagnetic material extending lengthwise in a direction parallel to the surface and having a sensitivity plane parallel to the surface, the first magnetoresistor being configured to conduct a current; and
forming, in the chip, a concentrator of a second ferromagnetic material and having an arm extending in a transverse direction to the sensitivity plane and in contact with the magnetoresistor.

13. The process according to claim 12, wherein the magnetoresistor has an elongated shape having a longitudinal direction, and the concentrator is formed by a plurality of concentrator segments in contact with the magnetoresistor, separated from each other and aligned with each other in the longitudinal direction.

14. The process according to claim 12, wherein forming a magnetoresistor and forming a concentrator comprise forming a trench in the substrate from the surface, coating walls of the trench and the surface with a ferromagnetic layer, and patterning the ferromagnetic layer.

15. The process according to claim 14, comprising, after coating the walls, filling the trench with insulating material before or after patterning.

16. The process according to claim 12, wherein forming a concentrator comprises: forming a trench in the substrate from the surface; coating walls of the trench and a portion of the surface adjacent to the trench with a first ferromagnetic layer; and forming the magnetoresistor at least partially on the first ferromagnetic layer.

17. The process according to claim 16, comprising:
after coating the walls and before forming the magnetoresistor, forming a protective layer above the first ferromagnetic layer, wherein forming the magnetoresistor comprises depositing a second ferromagnetic layer and patterning the second ferromagnetic layer; and
filling the trench with insulating material.

18. The process according to claim 12, comprising:
depositing a first insulating layer on the surface;
forming the magnetoresistor on the first insulating layer;
forming a trench in the substrate, through the first insulating layer and laterally to the magnetoresistor; and
depositing a ferromagnetic layer on walls of the trench and on a portion of the magnetoresistor.

19. The process according to claim 12, including electrically coupling a first end of the first magnetoresistor to a power supply input and electrically coupling a second end of the first magnetoresistor to an output terminal.

20. The process according to claim 12, wherein the first magnetoresistor and the concentrator are made of different materials with respect to each other.

21. An integrated magnetoresistive sensor, comprising:
a chip including a substrate having a surface and an insulating region covering the surface of the substrate
a ferromagnetic first magnetoresistor formed in the chip, the first magnetoresistor having a sensitivity plane parallel to the surface;
a ferromagnetic first concentrator formed in the chip, the first concentrator including an arm extending in a transverse direction to the sensitivity plane and having an end in contact with the first magnetoresistor;
a plurality of magnetoresistors including the first magnetoresistor, the magnetoresistors being connected to form a Wheatstone bridge and each including a magnetoresistive strip and a plurality of conductive transverse strips arranged on top of the magnetoresistive strip; and
a plurality of concentrators including the first concentrator, the concentrators extending parallel to and in contact with the magnetoresistive strips, respectively.

22. The sensor according to claim 21, wherein the first magnetoresistor extends into the insulating region, the substrate has a trench opening on the surface, the arm of the first concentrator extends within the trench, and the end of the arm projects from the trench and extends into the insulating region.

23. The sensor according to claim 21, wherein a first end of the first magnetoresistor is electrically coupled to a power supply input and a second end of the first magnetoresistor is electrically coupled to an output terminal.

* * * * *